US008000104B2

(12) United States Patent
Kim et al.

(10) Patent No.: US 8,000,104 B2
(45) Date of Patent: Aug. 16, 2011

(54) ELECTRONIC DEVICE HAVING ELECTROSTATIC DISCHARGE FUNCTION

(75) Inventors: Chul-kwi Kim, Seoul (KR); Koang-sik Lee, Suwon-si (KR); Dok-hwan Cha, Incheon (KR); Pil-sub Kim, Seoul (KR); Hyung-keun Song, Seoul (KR); Ba-da Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 829 days.

(21) Appl. No.: 12/027,320

(22) Filed: Feb. 7, 2008

(65) Prior Publication Data

US 2009/0027816 A1 Jan. 29, 2009

(30) Foreign Application Priority Data

Jul. 27, 2007 (KR) ........................ 10-2007-0075874

(51) Int. Cl.
*H05K 5/00* (2006.01)

(52) U.S. Cl. ........................ 361/730; 361/753; 361/715

(58) Field of Classification Search .................. 361/737, 361/715, 753, 759, 794, 799; 439/152, 153, 439/157, 296, 310, 345, 347, 359, 362, 364
See application file for complete search history.

(56) References Cited

U.S. PATENT DOCUMENTS

| | | | | |
|---|---|---|---|---|
| 6,059,583 | A * | 5/2000 | Croft et al. | 439/131 |
| 6,231,360 | B1 * | 5/2001 | Horie | 439/159 |
| 6,375,479 | B1 * | 4/2002 | Johnson et al. | 439/131 |
| 6,462,668 | B1 * | 10/2002 | Foseide | 340/687 |
| 6,654,841 | B2 * | 11/2003 | Lin | 710/301 |

* cited by examiner

*Primary Examiner* — Hung S Bui
(74) *Attorney, Agent, or Firm* — Stanzione & Kim, LLP

(57) ABSTRACT

An electronic device including a housing, a main circuit substrate disposed in one side of the housing; a connector unit which is disposed in an other side of the housing and is electrically connected to the main circuit substrate, and a discharging sheet disposed in the one side of the housing and is conductively connected to the connector unit to discharge static electricity generated in the connector unit is provided.

22 Claims, 5 Drawing Sheets

ELECTRONIC DEVICE HAVING ELECTROSTATIC DISCHARGE FUNCTION

CROSS-REFERENCE TO RELATED APPLICATIONS

This application claims priority under 35 U.S.C. §119(a) from Korean Patent Application No. 10-2007-0075874, filed on Jul. 27, 2007, in the Korean Intellectual Property Office, the disclosure of which is incorporated herein in its entirety by reference.

BACKGROUND OF THE INVENTION

1. Field of the Invention

The present general inventive concept relates to an electronic device, and more particularly, to an electronic device having an electrostatic discharge function to prevent damage due to static electricity.

2. Description of the Related Art

Recently, portable electronic devices, such as mobile phones, MP3 players, and the like, include a connector for connecting with other electronic devices such as computers, and the like. For example, a portable electronic device may include a USB (universal serial bus) connecting jack, which is a type of a male connector, and a computer may include a USB slot, which is a type of a female connector. When such connectors are connected to each other to exchange signals or the connection is released, static electricity may occasionally occur.

Meanwhile, since the portable electronic devices have been becoming compact and lighter, it is difficult to secure enough ground to discharge such static electricity. Accordingly, the static electricity flows into a main circuit substrate of the electronic device, so that main functions of the electronic device are negatively affected or cause malfunctions to sometimes occur. Accordingly, methods of solving the above-described problems are required.

SUMMARY OF THE INVENTION

The present general inventive concept provides a portable electronic device that can secure enough ground so that static electricity does not flow into a main circuit substrate.

Additional aspects and utilities of the present general inventive concept will be set forth in part in the description which follows and, in part, will be obvious from the description, or may be learned by practice of the general inventive concept.

The foregoing and/or other aspects and utilities of the general inventive concept may be achieved by providing an electronic device including a housing, a main circuit substrate disposed in one side of the housing, a connector unit disposed in an other side of the housing and is electrically connected to the main circuit substrate, and a discharging sheet disposed in the one side of the housing and is conductively connected to the connector unit to discharge static electricity generated in the connector unit.

The electronic device may include a battery disposed in the one side of the housing to supply power, and a battery gasket to cover at least a portion of the battery in order to protect the battery and to conductively adhere to the discharging sheet.

The connector unit may include a first frame which is made of metals and may include a first guide hole extending in a reciprocating direction, a second frame which includes a push button elastically biased in a protruding direction from a lateral portion of the housing and a second guiding hole that overlaps with the first guiding hole when the push button is pressed and has a first locking groove portion and a second locking groove portion in both end portions thereof, a pin which is made of metal and is accommodated in the first and second guiding holes so that the pin can reciprocate along the first and second guiding holes, a connector member fixedly coupled to the pin, a link that elastically presses the pin in a direction in which the connector member protrudes from the housing, and a connector circuit substrate which is mounted on the connector member and is conductively connected to the pin.

The first frame and the pin may be made of stainless steel.

The link may be made of metal and be conductively coupled to the first frame and the pin.

The link may be made of stainless steel.

The connector circuit substrate may include an opening formed to accommodate an end portion of the pin protruding towards the connector circuit substrate, a discharging terminal formed around the opening, and a pin contacting sheet which is connected to the discharging terminal and to conductively contact the end portion of the pin.

A first frame of the connector unit and the discharging sheet may be connected to each other by a screw.

The main circuit substrate and the connector circuit substrate may be connected to each other by a flexible printed circuit.

The foregoing and/or other aspects and utilities of the general inventive concept may also be achieved by providing an electronic device including a main circuit substrate, a connector unit electrically connected to the main circuit through a connector, and a static electricity path conductively connected to the connector unit to prevent static electricity from being conducted from the connector unit to the main circuit substrate through the connector.

The foregoing and/or other aspects and utilities of the general inventive concept may also be achieved by providing an electronic device including a housing, a main circuit substrate disposed in the housing, a discharging sheet spread-apart from the main circuit substrate in the housing, and a connector unit connected to the main circuit substrate, movable between a first position and a second position where the connector unit protrudes from the housing to be connected to an external device, and connected to the discharging sheet to discharge static electricity from the connector unit to the discharging sheet.

The main circuit substrate and the discharging sheet can be disposed in a first side of the housing, and the connector unit can be disposed in a second side of the housing.

The connector unit can include a connector circuit substrate to be connected to the external device, a connector member to accommodate the connector circuit substrate, and a frame unit to move the connector member between the first position and the second position with respect to the housing.

The connector unit can include a link unit to movably link the connector member and the frame unit.

The connector unit can include a connection bracket formed on the frame unit, and a terminal formed on the connector circuit substrate and electrically connected to the discharging sheet through the connection bracket.

Static electricity generated in a connector unit does not flow into a main circuit substrate by securing enough ground. Accordingly, damage of the main circuit substrate or malfunction of the electronic device due to the static electricity can be prevented.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
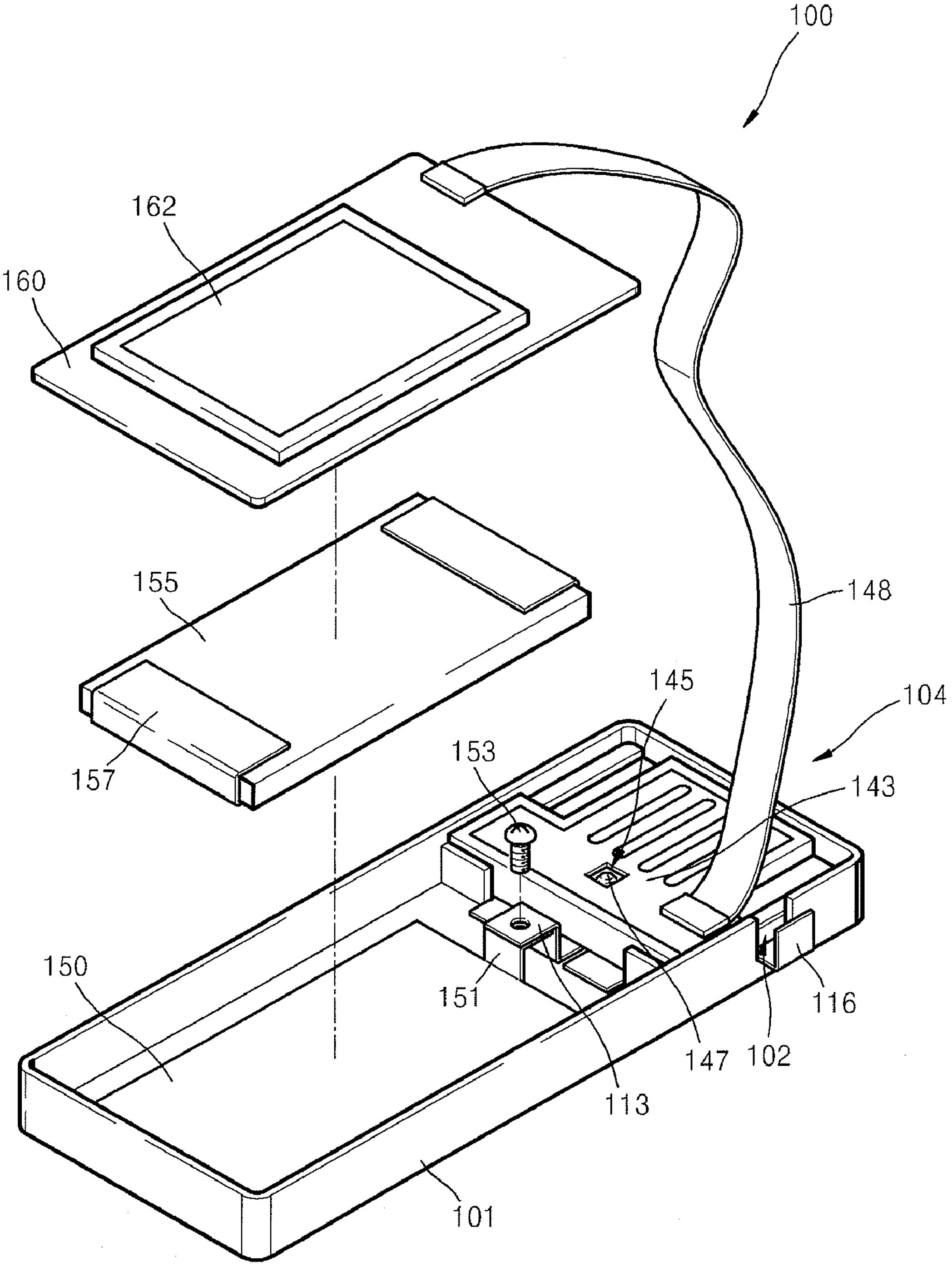
FIG. 1 is an exploded perspective view illustrating an electronic device according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
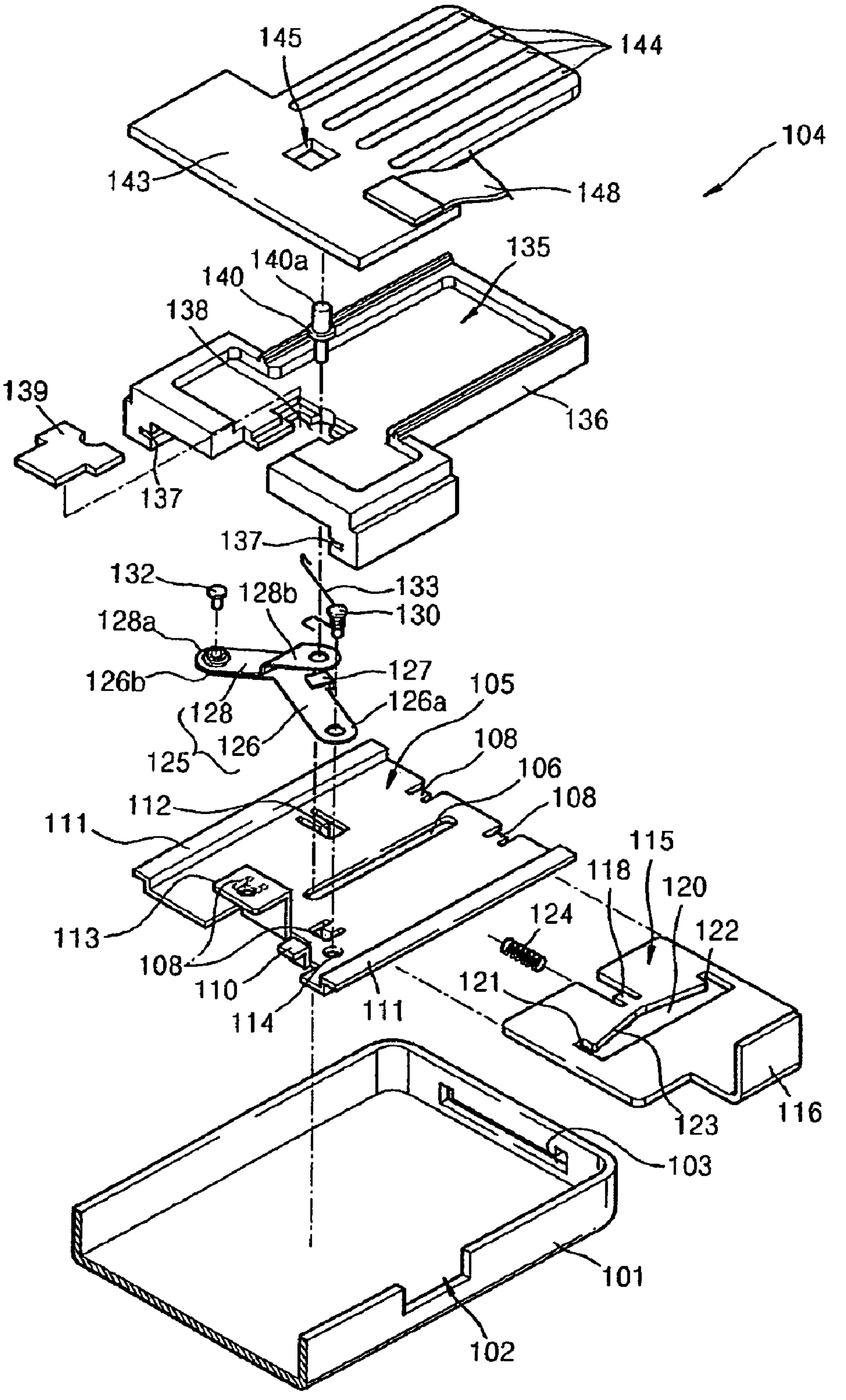
FIG. 2 is an exploded perspective view illustrating a connector unit of FIG. 1, wherein the connector unit is protrusible.
Figure 3:
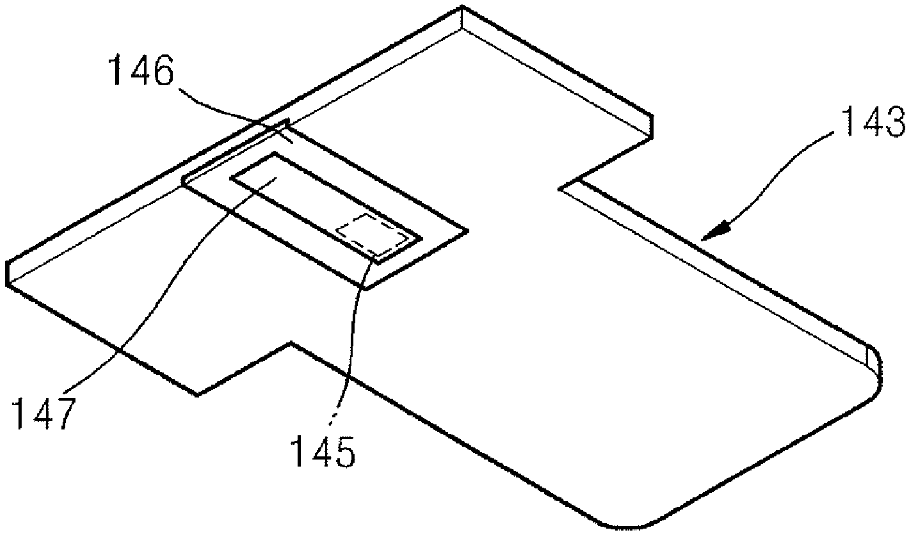
FIG. 3 is a perspective view illustrating a bottom surface of a connector circuit substrate of FIG. 1.

FIG. 1 is an exploded perspective view illustrating an electronic device 100 according to an embodiment of the present general inventive concept. FIG. 2 is an exploded perspective view illustrating a connector unit 104 of FIG. 1, wherein the connector unit 104 is protrusible. FIG. 3 is a perspective view of a bottom surface of a connector circuit substrate 143 of FIG. 1.

Referring to FIG. 1, the electronic device 100 according to an embodiment of the present general inventive concept includes a housing including a base member 101 and a cover member (not illustrated) that is connected to the base member 101 to cover a front surface of the base member 101, a main circuit substrate 160 disposed in one side of the housing, a display panel 162, a battery 155, a discharging sheet 150, and the connector unit 104 disposed in the other side of the housing. The electronic device 100 can be a portable MP3 player, however the electronic device 100 of the present general inventive concept is not limited thereto, and may be a portable multimedia player (PMP), a mobile phone, and the like.

The connector unit 104 is inserted in the housing and includes the connector circuit substrate 143 that protrudes so as to connect with other electronic devices. Referring to FIG. 2, the connector unit 104 includes a first frame 105 disposed in the other side of the housing, a second frame 115 slidably attached to the first frame 105, a pin 140, a link 125, a connector member 135, and the connector circuit substrate 143 mounted on the connector member 135.

A first through hole 103 is formed in a front surface of the base member 101 and a second through hole 102 is formed in one side surface of the base member 101. A protruding portion 136 of the connector member 135 protrudes through the first through hole 103, and a push button 116, included in the second frame 115, protrudes to be elastically pressed through the second through hole 102.

The first frame 105 is made of metal and, for example, may be made of stainless steel. The first frame 105 includes a first guiding hole 106 extending in a reciprocating direction of the connector member 135 and a pair of guide rails 111 extending in the same reciprocating direction parallel to the first guiding hole 106. The pair of guide rails 111 are slidably coupled to a pair of guide slits 137 formed in a lower surface of the connector member 135. The first frame 105 also includes four second frame coupling brackets 108 that slidably support the second frame 115 and a connection bracket 113 to connect with the discharging sheet 150 (see FIG. 1). The connection bracket 113 is a conductive material extended from a main portion of the first frame 105.

The second frame 115 is coupled to the second frame coupling brackets 108 so that the second frame 115 is slidably coupled to the first frame 105 in a perpendicular direction to the reciprocating direction of the connector member 135. The second frame 115 is elastically biased in a direction in which the push button 116 protrudes to a side of the housing by a compression spring 124. An end of the compression spring 124 is supported by a compression spring bracket 112 formed in the first frame 105 and the other end of the compression spring 124 is supported by a compression spring bracket 118 formed in the second frame 115.

The second frame 115 includes a second guiding hole 120 that overlaps with the first guiding hole 106 when the push button 116 is pressed to move the second frame 115 with respect to the first frame 105. The second guiding hole 120 includes a first locking groove portion 121 and a second locking groove portion 122, which are concavely grooved in both ends thereof in a direction in which a compression force to the push button 116 is applied. The second guiding hole 120 also includes a V-shaped lateral portion 123 that slants in the direction in which a compression force to the push button 116 is applied towards a center of the second guiding hole 120. The second frame 115 may be also formed of metal, and, for example, may be formed of stainless steel.

The link 125 includes a first joint 126 that is connected to the first frame 105, and a second joint 128 that is connected to the first joint 126 and the pin 140. The first joint 126 is rotatably mounted on the first frame 105 by a first stud 130 which is inserted through a first end portion 126*a* of the first joint 126 into a first stud inserting hole 114 formed in the first frame 105. Also, a second joint 128 is rotatably mounted on the first joint 126 by a second stud 132, which is sequentially inserted into a first end portion 128*a* of the second joint 128 and a second end portion 126*b* of the first joint 126. The link 125 may be also formed of metal, and, for example, may be formed of stainless steel.

The pin 140 is sequentially inserted into a pin accommodating through hole 138 of the connector member 135, a second end portion 128*b* of the second joint 128, the first guiding hole 106, and the second guiding hole 120, and is fixed with respect to the connector member 135 by a pin cover 139 that covers the pin accommodating through hole 138. The connector circuit substrate 143, including a connecting terminal 144 to connect with a connector unit (not illustrated) of another electronic device (not illustrated), is attached to an upper surface of the connector member 135. Referring to FIG. 1, the connector circuit substrate 143 is electrically connected to the main circuit substrate 160 by a flexible printed circuit 148. Although not illustrated in detail in the drawing, the connecting terminal 144 is conductively connected to a flexible printed circuit 148 by a predetermined circuit pattern.

The pin 140 may be formed of metal, and, for example, may be formed of stainless steel. An upper end portion 140*a* of the pin 140 protrudes towards the connector circuit substrate 143. Referring to FIG. 3, the connector circuit substrate 143 includes an opening 145 formed so as to accommodate the upper end portion 140*a* of the pin 140, a discharging terminal 146 formed around the opening 145 on a lower surface of the connector circuit substrate 143 facing the connector member 135, and a pin contacting sheet 147 conductively connected to the discharging terminal 146 and contacting with the upper end portion 140*a* (FIG. 2) of the pin 140. The discharging terminal 146 is conductively connected to the connecting terminal 144. Also, the discharging terminal 146 is conductively connected to the connection bracket 113.

The pin contacting sheet 147 is made of a conductive sheet, and, for example, may be made of a conductive sheet used to shield the electronic device 100 from electromagnetic interference (EMI). The pin contacting sheet 147 shields an opening 145, however, since the pin contacting sheet 147 is made of a flexible sheet, the pin contacting sheet 147 shields from upper end portion 140*a* of the pin 140 protruding and accommodated in the opening 145. Accordingly, regardless of a reciprocating motion of the pin 140, a secure contact between the pin contacting sheet 147 and the upper end portion 140*a* can be maintained.

Referring to FIG. 2, the link 125 elastically presses the pin 140 using an elastic restoration force of a torsion spring 133. More specifically, the first stud 130 is inserted into the torsion spring 133, an end portion of the torsion spring 133 is supported by a torsion spring bracket 110 formed in the first frame 105, and the other end portion of the torsion spring 133 is supported by a torsion spring bracket 127 formed in the first joint 126. Accordingly, the connector member 135, connected to the pin 140, is elastically biased in a direction in which the protruding portion 136 protrudes outside of the housing.

The operations of the connector unit 104, which is protrusible, having the above-described structure will now be described.

Figure 4A:
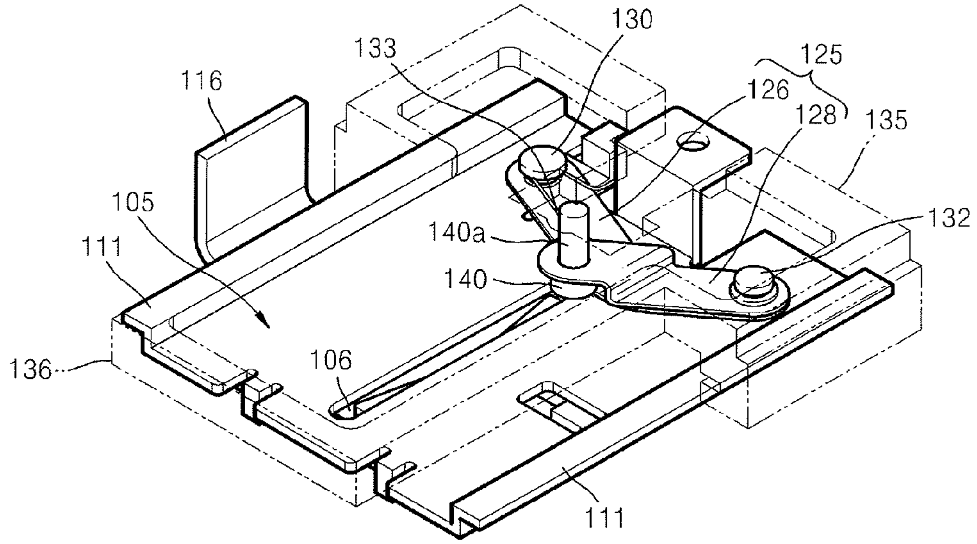
FIGS. 4A and 4B are perspective views illustrating sequential operations of the connector unit of FIG. 2.
Figure 4B:
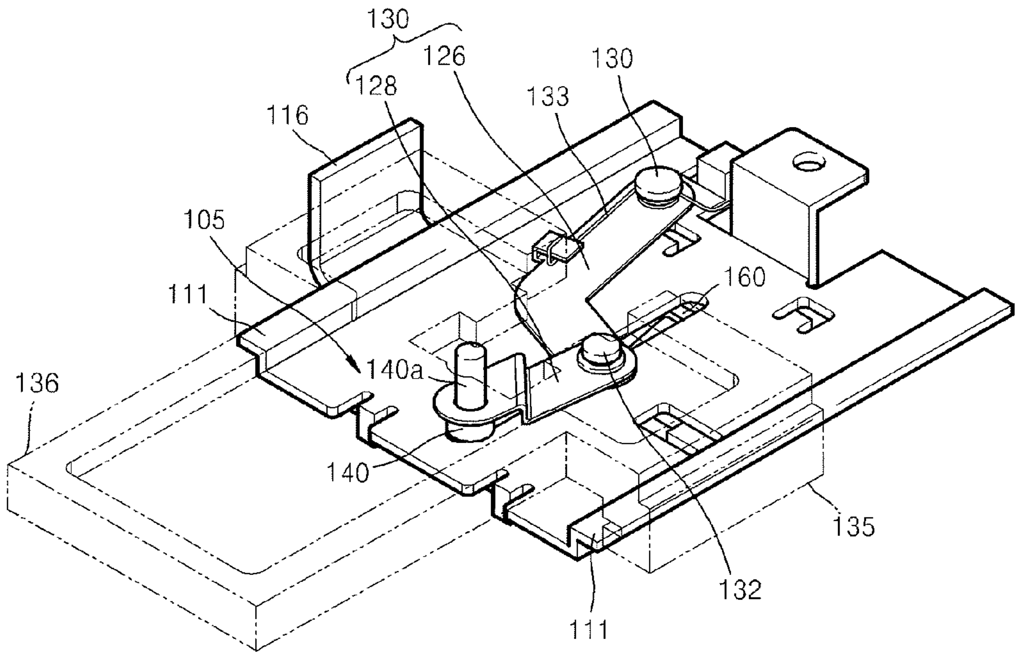
Figure 5A:
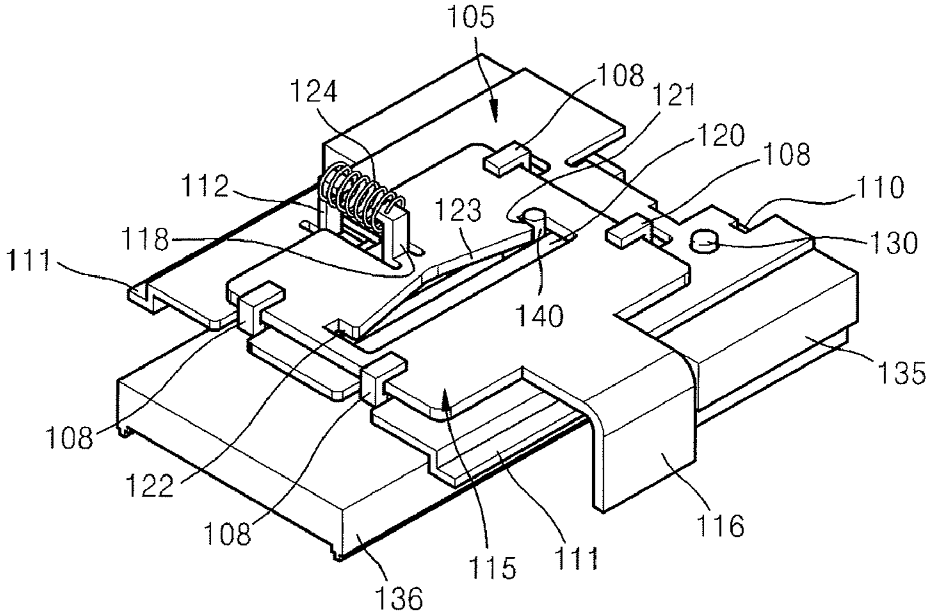
FIGS. 5A and 5B are reversed perspective views of the connector unit of FIG. 2 illustrating sequential operations of the connector unit of FIG. 2.
Figure 5B:
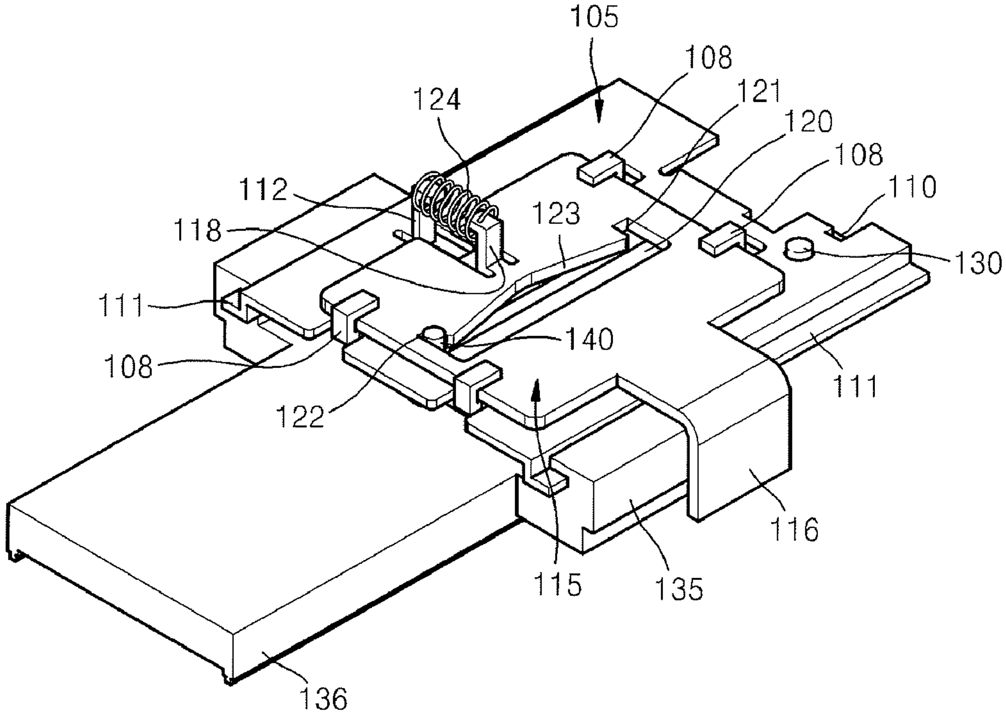

FIGS. 4A and 4B are perspective views illustrating sequential operations of the connector unit 104 of FIG. 2. FIGS. 5A and 5B are reversed perspective views of the connector unit 104 of FIG. 2 illustrating sequential operations of the connector unit 104 of FIG. 2.

Referring to FIGS. 4A and 5A, in a locked state, that is, when the protruding portion 136 of the connector member 135 is inserted into the housing of an electronic device, the pin 140 is located in an inner end portion of the first guiding hole 106 and in the first locking groove portion 121 of the second guiding hole 120. The pin 140 is elastically biased by the torsion spring 133, however the pin 140 is in a locked state since the pin 140 is locked by the first locking groove portion 121 of the second guiding hole 120.

When the push button 116 is pressed, the first locking groove portion 121 moves so as to release the pin 140 from its lock state. Accordingly, the pin 140 moves towards the outside of the housing along the first guiding hole 106 and the V-shaped lateral portion 123 of the second guiding hole 120 by the elastic restoration force of the torsion spring 133. Accordingly, the protruding portion 136 of the connector member 135 protrudes to the outside of the housing. Thus, the connecting member 144 protrudes from the base member 101 to be connected to an external device to transmit data or exchange data with the external device.

Referring to FIGS. 4B and 5B, when the protruding portion 136 of the connector member 135 protrudes to a protrusion limit position, the pin 140 is located in an outer end portion of the first guiding hole 106 and in the second locking groove portion 122 of the second guiding hole 120. At this point, the pin 140 is locked by the second locking groove portion 122 of the second guiding hole 120, and accordingly, the protruding portion 136 of the connector member 135 is locked in a protruded state so that the protruding portion 136 cannot be inserted into the housing.

In order to re-insert the protruding portion 136 into the housing, the locked state of the pin 140 accommodated in the second locking groove portion 122 is released by pressing the push button 116 so that the protruding portion 136 can be pushed into the housing. Thus, the pin 140 moves back along the first guiding hole 106 and the second guiding hole 120, and as illustrated in FIGS. 4A and 5A, the pin 140 is seated in the first locking groove portion 121 and the connector member 135 is re-locked in an inserted state into the housing.

Referring to FIG. 1, the discharging sheet 150 is disposed on the base member 101, and a tag 151, formed in an end portion of the discharging sheet 150, is conductively connected to the connection bracket 113 formed in an end portion of the first frame 105 (see FIG. 2). The discharging sheet 150 is made of a conductive sheet, and, for example, may be made of a conductive sheet used to shield the electronic device 100 from electromagnetic interference (EMI), similarly to the pin contacting sheet 147. Accordingly, the electronic device 100, according to the present embodiment of the present general inventive concept, can provide an effective electrostatic discharge and shield from electromagnetic waves.

The main circuit substrate 160, to process main functions (for example, producing music or image files, and a sound-recording or video-recording) of the electronic device 100, is disposed on the discharging sheet 150. The display panel 162, for example a liquid crystal display (LCD), is mounted on the main circuit substrate 160. The main circuit substrate 160 and the connector circuit substrate 143 are connected to each other by the flexible printed circuit 148.

The battery 155, supplying power to realize functions of the electronic device 100, is interposed between the main circuit substrate 160 and the discharging sheet 150, and may be a secondary cell capable of being recharged. The electronic device 100 includes a conductive battery gasket 157 covering at least a portion of the battery 155 in order to protect the battery 155. In the present embodiment of the present general inventive concept, the battery gasket 157 may be made of a conductive sheet used to shield from EMI, similarly to the pin contacting sheet 147. Also, the battery gasket 157 has an adhesive property in both sides thereof, so that one side of the battery gasket 157 covers and adheres to the battery 155 and the other side of the battery gasket 157 adheres to the discharging sheet 150. Accordingly, the battery gasket 157 and the discharging sheet 150 are conductively connected to each other.

Referring to FIGS. 1 through 3, in the electronic device 100, the discharging terminal 146 formed in the connector circuit substrate 143, the pin contacting sheet 147, the pin 140, the first frame 105, the discharging sheet 150, and the battery gasket 157 are conductively and sequentially connected. Accordingly, if static electricity is generated in the connector circuit substrate 143, in particular, in the connecting terminal 144 (see FIG. 2) during being connected with other electronic devices (not illustrated) using the connector unit 104, the static electricity is sequentially and momentarily discharged to the discharging terminal 146 that is conductively connected to the connecting terminal 144, the pin contacting sheet 147, the pin 140, the first frame 105, the discharging sheet 150, and the battery gasket 157. Since grounding is sufficiently secured due to the discharging sheet 150 and the battery gasket 157, the static electricity is prevented from flowing into the main circuit substrate 160 through the flexible printed circuit 148 when static electricity is generated in the electronic device 100. Accordingly, damage to the main circuit substrate 160 or malfunction of the electronic device 100 due to the static electricity is prevented.

Although various embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. An electronic device, comprising:
a housing;
a main circuit substrate disposed in one side of the housing;
a connector unit having a connector unit circuit substrate disposed in an other side of the housing and electrically connected to the main circuit substrate;
a discharging sheet disposed in the one side of the housing and is conductively connected to the connector unit to discharge static electricity generated in the connector unit;
a battery disposed in the one side of the housing to supply power; and
a battery gasket to cover at least a portion of the battery to protect the battery and to conductively adhere to the discharging sheet.

2. The electronic device of claim 1, wherein the connector unit comprises:
a first frame which is made of metal and includes a first guide hole extending in a reciprocating direction;
a second frame including a push button elastically biased in a protruding direction from a lateral portion of the housing and a second guiding hole that overlaps with the first guiding hole when the push button is pressed and has a first locking groove portion and a second locking groove portion in both end portions of the second guiding hole;
a pin which is made of metal and is accommodated in the first and second guiding holes so that the pin can reciprocate along the first and second guiding holes;
a connector member fixedly coupled to the pin;
a link that elastically presses the pin in a direction in which the connector member protrudes from the housing; and
a connector circuit substrate which is mounted on the connector member and is conductively connected to the pin.

3. The electronic device of claim 2, wherein the first frame and the pin are made of stainless steel.

4. The electronic device of claim 3, wherein the link is made of stainless steel.

5. The electronic device of claim 2, wherein the link is made of metal and is conductively coupled to the first frame and the pin.

6. The electronic device of claim 2, wherein the connector circuit substrate comprises:
an opening formed to accommodate an end portion of the pin protruding towards the connector circuit substrate;
a discharging terminal formed around the opening; and
a pin contacting sheet which is connected to the discharging terminal and to conductively contact the end portion of the pin.

7. The electronic device of claim 2, wherein a first frame of the connector unit and the discharging sheet are connected to each other by a screw.

8. The electronic device of claim 2, wherein the main circuit substrate and the connector circuit substrate are connected to each other by a flexible printed circuit.

9. An electronic device, comprising:
a main circuit substrate;
a connector unit electrically connected to the main circuit through a connector; and
a static electricity path conductively connected to the connector unit to prevent static electricity from being conducted from the connector unit to the main circuit substrate through the connector,
wherein the connector unit further comprises:
a connector circuit substrate including an opening, a discharging terminal formed around the opening on a lower surface of the connector circuit substrate and a pin contacting sheet conductively connected to the discharging terminal.

10. The electronic device of claim 9, wherein the connector comprises:
a flexible printed circuit.

11. The electronic device of claim 9, further comprising:
a battery having a conductive battery gasket in contact with the connecting unit.

12. The electrical device of claim 11, further comprising:
a reciprocating pin having one end accommodated in the opening of the connector circuit substrate and in contact with the pin contacting sheet.

13. The electronic device of claim 12, wherein the static electricity path comprises:
a discharging sheet to discharge static electricity generated by the connector unit.

14. The electronic device of claim 13, wherein the static electricity path further comprises:
the discharging terminal, the pin connecting sheet, the pin and the battery gasket.

15. An electronic device, comprising:
a housing having a battery;
a main circuit substrate disposed in the housing;
a discharging sheet spread-apart from the main circuit substrate in the housing by the battery; and
a connector unit having a first connecting unit to connect to the main circuit substrate via a flexible printed circuit board and a second connecting unit separate from the first connecting unit to electrically connect to the discharging sheet, movable between a first position and a second position such that the connector unit protrudes from the housing to be connected to an external device, and connected to the discharging sheet to discharge static electricity from the connector unit to the discharging sheet.

16. The electronic device of claim 15, wherein the main circuit substrate and the discharging sheet are disposed in a first side of the housing; and
the connector unit is disposed in a second side of the housing.

17. The electronic device of claim 15, wherein the connector unit comprises:
a connector circuit substrate to be connected to the external device;
a connector member to accommodate the connector circuit substrate; and
a frame unit to move the connector member between the first position and the second position with respect to the housing.

18. The electronic device of claim 17, wherein the connector unit comprises:
a link unit to movably link the connector member and the frame unit.

19. The electronic device of claim 17, wherein the connector unit comprises:
a connection bracket formed on the frame unit; and
a terminal formed on the connector circuit substrate and electrically connected to the discharging sheet through the connection bracket.

20. The electronic device of claim 15, further comprising:
a display panel mounted on the main circuit substrate.

21. An electronic device, comprising:
a housing;
a main circuit substrate disposed in one side of the housing;

a connector unit disposed in an other side of the housing and is electrically connected to the main circuit substrate; and a discharging sheet disposed in the one side of the housing and is conductively connected to the connector unit to discharge static electricity generated in the connector unit, wherein the connector unit comprises:

a first frame which is made of metal and includes a first guide hole extending in a reciprocating direction;

a second frame including a push button elastically biased in a protruding direction from a lateral portion of the housing and a second guiding hole that overlaps with the first guiding hole when the push button is pressed and has a first locking groove portion and a second locking groove portion in both end portions of the second guiding hole;

a pin which is made of metal and is accommodated in the first and second guiding holes so that the pin can reciprocate along the first and second guiding holes;

a connector member fixedly coupled to the pin;

a link that elastically presses the pin in a direction in which the connector member protrudes from the housing; and a connector circuit substrate which is mounted on the connector member and is conductively connected to the pin.

22. An electronic device, comprising:

a housing;

a main circuit substrate disposed in the housing;

a discharging sheet spread-apart from the main circuit substrate in the housing; and a connector unit connected to the main circuit substrate, movable between a first position and a second position where the connector unit protrudes from the housing to be connected to an external device, and connected to the discharging sheet to discharge static electricity from the connector unit to the discharging sheet, wherein the connector unit comprises:

a connector circuit substrate to be connected to the external device;

a connector member to accommodate the connector circuit substrate; and a frame unit to move the connector member between the first position and the second position with respect to the housing.

* * * * *